(12) United States Patent
Roth et al.

(10) Patent No.: US 10,586,756 B2
(45) Date of Patent: Mar. 10, 2020

(54) CHIP CARRIER CONFIGURED FOR DELAMINATION-FREE ENCAPSULATION AND STABLE SINTERING

(71) Applicant: Infineon Technologies AG, Neubiberg (DE)

(72) Inventors: Alexander Roth, Zeitlarn (DE); Andreas Grassmann, Regensburg (DE); Juergen Hoegerl, Regensburg (DE); Angela Kessler, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/723,431

(22) Filed: Oct. 3, 2017

(65) Prior Publication Data

US 2018/0096919 A1 Apr. 5, 2018

(30) Foreign Application Priority Data

Oct. 4, 2016 (DE) .................. 10 2016 118 784

(51) Int. Cl.
*H01L 23/495* (2006.01)
*H01L 23/29* (2006.01)
(Continued)

(52) U.S. Cl.
CPC ...... *H01L 23/49558* (2013.01); *H01L 21/561* (2013.01); *H01L 23/291* (2013.01); *H01L 23/3121* (2013.01); *H01L 23/3735* (2013.01); *H01L 23/4334* (2013.01); *H01L 23/49513* (2013.01); *H01L 23/49531* (2013.01); *H01L 23/49575* (2013.01); *H01L 23/49586* (2013.01); *H01L 24/32* (2013.01); *H01L 24/97* (2013.01); *H05K 7/1007* (2013.01); *H01L 24/29* (2013.01); *H01L 24/73* (2013.01); *H01L 24/83* (2013.01); *H01L 2224/29339* (2013.01); *H01L 2224/32225* (2013.01); *H01L 2224/33181* (2013.01);
(Continued)

(58) Field of Classification Search
CPC ..................................... H05K 7/1007
See application file for complete search history.

(56) References Cited

U.S. PATENT DOCUMENTS 3,744,120 A 7/1973 Burgess et al.
3,766,634 A 10/1973 Babcock et al.
(Continued)

FOREIGN PATENT DOCUMENTS

CN 101866901 A 10/2010
CN 104637832 A 5/2015
(Continued)

OTHER PUBLICATIONS

[IWA85] Iwase, N.; Anzai, K.; Shinozaki, K.; Hirao, O.; Troung T.; Sugiura, Y. (1985) Thick Film and Direct Bond Copper Forming Technologies for Aluminum Nitride Substrate. In: Components, Hybrids, and Manufacturing Technology, IEEE Transactions on, Jg. 8, H. 2. p. 253-258.
(Continued)

*Primary Examiner* — Mounir S Amer

(57) ABSTRACT

A chip carrier for carrying an electronic chip, wherein the chip carrier comprises a mounting section configured for mounting an electronic chip by sintering, and an encapsulation section configured for being encapsulated by an encapsulant.

22 Claims, 3 Drawing Sheets

(51) Int. Cl.
*H01L 23/00* (2006.01)
*H05K 7/10* (2006.01)
*H01L 23/31* (2006.01)
*H01L 23/433* (2006.01)
*H01L 21/56* (2006.01)
*H01L 23/373* (2006.01)

(52) U.S. Cl.
CPC ............ *H01L 2224/48091* (2013.01); *H01L 2224/73215* (2013.01); *H01L 2224/73265* (2013.01); *H01L 2224/8384* (2013.01); *H01L 2224/83447* (2013.01); *H01L 2224/83951* (2013.01); *H01L 2924/00014* (2013.01); *H01L 2924/1203* (2013.01); *H01L 2924/13055* (2013.01); *H01L 2924/181* (2013.01); *H01L 2924/18301* (2013.01)

(56) References Cited

U.S. PATENT DOCUMENTS

| | | | |
|---|---|---|---|
| 5,527,620 | A | 6/1996 | Schulz-Harder |
| 6,066,219 | A | 5/2000 | Schulz-Harder et al. |
| 7,036,711 | B2 | 5/2006 | Schutz-Harder |
| 8,822,036 | B1 | 9/2014 | Wereszczak |
| 9,679,832 | B1* | 6/2017 | Heng ................ H01L 23/49513 |
| 2008/0160183 | A1 | 7/2008 | Ide et al. |
| 2009/0243089 | A1 | 10/2009 | Hohlfeld et al. |
| 2009/0244868 | A1 | 10/2009 | Morita et al. |
| 2011/0156094 | A1 | 6/2011 | Haederli et al. |
| 2012/0061815 | A1 | 3/2012 | Sontheimer et al. |
| 2013/0175701 | A1* | 7/2013 | Park ..................... H01L 21/568 257/774 |
| 2014/0147695 | A1 | 5/2014 | Sunachi et al. |
| 2014/0312497 | A1* | 10/2014 | Goh ......................... H01L 23/36 257/741 |
| 2014/0327128 | A1 | 11/2014 | Yoo et al. |
| 2015/0054166 | A1* | 2/2015 | Beer ....................... H01L 21/56 257/773 |
| 2015/0092379 | A1 | 4/2015 | Yoshimatsu et al. |
| 2015/0102479 | A1* | 4/2015 | Fuergut .................. H01L 24/85 257/706 |
| 2015/0155267 | A1* | 6/2015 | Hoegerl .............. H01L 25/0655 257/698 |
| 2016/0079087 | A1 | 3/2016 | Yeduru et al. |

FOREIGN PATENT DOCUMENTS

| | | |
|---|---|---|
| CN | 104637910 A | 5/2015 |
| DE | 196 15 481.2 B4 | 10/2006 |
| DE | 10 2004 056 879 B4 | 12/2008 |
| DE | 10 2010 023 637 B4 | 1/2012 |
| JP | 2006-202586 A | 8/2006 |
| JP | 2006-222347 A | 8/2006 |
| JP | 2013-229457 A | 11/2013 |
| JP | 2015-207793 A | 11/2015 |

OTHER PUBLICATIONS

[ROT10] Roth, A. (2010): Benchmark: Performance & Reliability of Ceramic based Substrates. In: ECPE: Power Electronics Substrates—Materials, Performance, Processing and Reliability. Munich (ECPE Workshop on Substrates).
[SCHU04] Schulz-Harder, J.; Rogg, A.; Exel, K. (2004) Recent Developments of DBC Substrates for High Resolution Requirements (Proceedings of the Industrial Electronics Conference, 15).
[SCHU03] Schulz-Harder, J. (2003): Advantages and new development of direct bonded copper substrates. In: Microelectronics Reliability, Jg. 43, H. 3, p. 359-365.
[YOS89] Yoshino, Y. (1989): Role of Oxygen in Bonding Copper to Alumina. In: Journal of the American Ceramic Society, Jg. 72, H. 8, p. 1322-1327.
[YOS91] Yoshino, Y.; Ohtsu, H. (1991): Interface Structure and Bond Strength of Copper-Bonded Alumina Substrates. In: Journal of the American Ceramic Society, Jg. 74, H. 9, p. 2184-2188.
[YOS92a] Yoshino, Y.; Shibata, T. (1992): Structure and Bond Strength of a Copper/Alumina Interface. In: Journal of the American Ceramic Society, Jg. 75, H. 10, p. 2756-2760.
Fairchild, non-patent-literature: http://www.amaa.de/previous-conferences/amaa-2014/presentations-2014/140624_AMAA_ReliabilityofSiCPM_AOtto_public.pdf.
http://www.irf.com/technical-info/whitepaper/coolir2d.pdf.
Yoshino, Y.; Ohtsu, H.; Shibata, T. (1992): Thermally Induced Failure of Copper-Bonded Alumina Substrates for Electronic Packaging. In: Journal of the American Ceramic Society, vol. 15, No. 12, p. 3353-3357.
Schulz-Harder, J.; Exel: Advanced DBC (Direct Bonded Copper) Substrates for High Power and High Voltage Electronics.

* cited by examiner

CHIP CARRIER CONFIGURED FOR DELAMINATION-FREE ENCAPSULATION AND STABLE SINTERING

BACKGROUND OF THE INVENTION

Field of the Invention

The present invention relates to chip carriers, to a package, to a vehicle, to a method of use, and to methods of manufacturing.

Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

There is still potentially room to improve reliability of a package while rendering its manufacturing process simple.

SUMMARY OF THE INVENTION

There may be a need for a package allowing for a simple manufacturability while ensuring reliability of the package.

According to an exemplary embodiment, a chip carrier for carrying an electronic chip is provided, wherein the chip carrier comprises a mounting section configured for mounting an electronic chip by sintering, and an encapsulation section configured (for example roughened) for being encapsulated by an encapsulant.

According to another exemplary embodiment, a chip carrier for carrying an electronic chip is provided, wherein the chip carrier comprises a mounting and encapsulation section having a common surface configured for mounting an electronic chip by sintering and for being roughened for being encapsulated by a mold-type encapsulant.

According to another exemplary embodiment, a package is provided which comprises a chip carrier having the above mentioned features, at least one electronic chip mounted on the mounting section or on the mounting and encapsulation section of the chip carrier, and an encapsulant encapsulating at least part of the at least one electronic chip and at least part of the encapsulation section or of the mounting and encapsulation section.

According to still another exemplary embodiment, a vehicle is provided which comprises a package or a chip carrier having the above mentioned features.

According to yet another exemplary embodiment, a method of manufacturing a chip carrier for carrying an electronic chip is provided, wherein the method comprises forming a mounting section configured for mounting an electronic chip by sintering, and forming a roughened encapsulation section configured for being encapsulated by an encapsulant.

According to yet another exemplary embodiment, a method of manufacturing a package is provided, wherein the method comprises providing a chip carrier having the above mentioned features, mounting at least one electronic chip on the mounting section of the chip carrier, and encapsulating at least part of the at least one electronic chip and at least part of the encapsulation section by an encapsulant.

According to yet another exemplary embodiment, a package having the above mentioned features or a chip carrier having the above-mentioned features is used for an automotive application.

According to an exemplary embodiment, a chip carrier is provided which allows for a reliable operation even under harsh conditions such as a significant development of heat during operation of a package with such a chip carrier and an embedded electronic chip. This high reliability results from a strong suppression of any tendency of delamination of elements of the package and of the chip carrier as a consequence of a specific configuration of different surface portions of the chip carrier. A mounting section is namely configured (in particular provided with sinterable material) for mounting the electronic chip by sintering, i.e. is prepared for establishing a stable sinter connection with the electronic chip. Another surface portion of the chip carrier, i.e. the encapsulation section, is specifically configured (in particular roughened) for being encapsulated by an encapsulant such as a mold compound with proper adhesion to the encapsulant and hence without the risk of delamination between the encapsulation section and the encapsulant material. By specifically configuring the two mentioned functional surface portions of the chip carrier, even in the presence of thermal and/or mechanical load in an interior of a package being formed on the basis of such a chip carrier, heat may be reliably dissipated from an interior of the package and is prevented from harming the chip carrier or the package. The mechanical reliability of the sinter connection of the electronic chips encapsulated by the encapsulant is very high. Moreover, the described chip carrier architecture can be manufactured with reasonable effort.

According to another embodiment of the invention, a combined mounting and encapsulation section (for instance a homogeneous sinterable roughened piece of material) may be provided on the chip carrier and may fulfil both tasks of adhering to encapsulant and strongly bonding the chip(s) by sintering with a common integral structure rather than by two separately adjusted but different surface portions.

DESCRIPTION OF FURTHER EXEMPLARY EMBODIMENTS

In the following, further exemplary embodiments of the chip carriers, the package, the vehicle, and the methods will be explained.

A gist of an exemplary embodiment of the invention is an encapsulated (in particular molded) package with at least one electronic chip within the encapsulant and sintered (in particular silver sintered) on a chip carrier (in particular a Direct Copper Bonding substrate) within the encapsulant. More specifically and highly preferred, at least part of the surface of the chip carrier in direct contact with the encapsulant may be roughened or may have a higher roughness than a mounting section on which the electronic chip is sintered. Roughing is believed to improve adhesion with the encapsulant. Sintering establishes a temperature robust mechanically stable connection of the electronic chip(s).

In the context of the present application, the term "sintering" may particularly denote a process of compacting and forming a solid mass of material by heat and/or pressure without melting it to the point of liquefaction. A driving force for densification is the change in free energy from the decrease in surface area and lowering of the surface free energy. Sintering may form modified but lower-energy solid-solid interfaces with a total decrease in free energy.

In the context of the present application, the term "roughening" may denote each procedure by which a connection surface (i.e. a contact surface to an encapsulant) is increased compared to a corresponding projection surface (i.e. a surface area of the connection area as seen in a plan view). Hence, the term roughening should be understood in a broad way and should not only cover mechanically roughening, but also chemically roughening and other techniques resulting in the formation of a micropatterned surface. Preferably, the encapsulation section may have microstructures where a relation between a projected surface area and a flattened surface area is larger than 1.1, in particular is larger than 1.5.

A roughening procedure may be carried out by an exemplary embodiment of the invention as follows: A copper surface may be made subject to an etching procedure using an acid (such as $H_2SO_4$) having an additive (for instance an organic additive) functioning as a local etch inhibitor (i.e. locally blocking etching of the copper surface). This generates a pattern of etched (generating microindentations) and non-etched (generating microprotrusions) regions. It is also possible that an etching procedure is carried out allowing for an etching predominantly at crystalline defects. The etching can convert the copper to copper oxide, leaving however local copper islands or spots unetched. At least a part of the copper oxide may be removed (for instance chemically or mechanically), resulting in a roughened copper surface.

Apart from the described procedures, it is possible to carry out a mechanical procedure (for instance a beam of glass spheres), galvanic procedures (for instance deposition of raw copper), or other procedures capable of generating microstructures.

Preferably, a surface of the encapsulation section has a higher roughness than a surface of the mounting section. A high roughness of the encapsulation section results in a proper adhesion between material of the chip carrier and the encapsulant. However, as a mounting base for an electronic chip (in particular a semiconductor chip), a (in particular macroscopically) smooth mounting surface is desired in order to obtain a high positional accuracy and orientation accuracy of the mounted electronic chip. Moreover, such a macroscopically even mounting surface may prevent an electronic chip (such as a semiconductor die) from breaking.

In an embodiment, a surface of the encapsulation section is hydrophilic. A hydrophile may be denoted as a substance that is attracted to, and tends to be dissolved, by water. A hydrophilic molecule is one whose interactions with water and other polar substances are more thermodynamically favorable than their interactions with hydrophobic solvents such as oil. When the encapsulation section is configured with a hydrophilic surface, the adhesion of a mold-type encapsulant to such a surface can be further promoted. Additionally or alternatively, a surface of the mounting section is hydrophobic. Hydrophobicity may be denoted as the physical property of a substance that is repelled from water. This material property is properly compatible with the formation of a strong bond upon sintering. In one embodiment, the surface of the encapsulation section is more hydrophilic than the surface of the mounting section.

In an embodiment, the mounting section is configured for mounting an electronic chip by silver sintering. In this embodiment, the mounting section may be specifically provided with silver material so as to enable a sintering process of the one or more electronic chips on this silver base. Silver sintering allows for a low ohmic and stable mounting of the electronic chip on the mounting section.

In an embodiment, the mounting section comprises a noble metal finish, in particular one of the group consisting of gold, silver, platinum, and palladium. A surface finish with a noble metal advantageously has only a low tendency of forming an oxide layer on its surface. Such an oxide layer is undesired since it may disturb the procedure of sintering. Sintering is particularly efficient when metallic particles contact one another directly without a metal oxide layer in between.

However, in another embodiment, the mounting section may be formed by an ignoble metal such as copper. In such an embodiment, care should be taken that the surface of such an ignoble metal is substantially free of metal oxide. For conditioning such an ignoble metal for sintering, it is possible that metallic particles of such an ignoble metal are treated (for instance chemically) to remove a metal oxide surface layer prior to sintering.

In an embodiment, the mounting section is substantially free of contaminants that accelerate electrochemical migration. Electromechanical migration, i.e. the migration of particles within an interior of the package can be safely prevented when contaminants which may cause such an undesired electrochemical migration are not present in the mounting section.

In an embodiment, the contaminants to be avoided in the mounting section comprise sulphur and halogenides being capable of promoting electrochemical migration. It has turned out that in particular sulphur ions as well as halogenides (such as chlorine or fluorine) have the capability of causing a pronounced electrochemical migration which may deteriorate reliability of the chip carrier. It should however be mentioned that sulphur can also be present in a chemically bonded state (for instance as part of an adhesion promoter) in which it does not have a pronounced tendency of promoting electrochemical migration.

In an embodiment, a concentration of the mentioned and/or other contaminants in the mounting section is limited to be below 200 ppm, in particular below 100 ppm. When such a contamination is below the mentioned values, a reliable operation of the chip carrier may still be guaranteed.

In an embodiment, the mounting section is substantially free of surface oxide. Surface cleaning, for instance chemically and/or mechanically, with a plasma, etc., may remove any remaining surface oxide which may deteriorate the contact between sinterable particles and may weaken the adhesion between the connected materials. Therefore, ensuring that the surface of the mounting section is free of metal oxide increases the reliability of the correspondingly manufactured chip carrier.

In an embodiment, the encapsulation section has a surface roughness defined by microstructures with dimensions in a range between 0.25 µm and 20 µm, in particular in a range between 1 µm and 4 µm.

By a corresponding adjustment of the surface roughness, the ratio between a connection area of the roughened surface to be encapsulated and a projection area (i.e. an area seen when looking from above on the roughened surface) of this connection area may be at least 1.1, in particular at least 1.5, more particularly at least 2, even more particularly at least 5.

Still referring to the previously mentioned ratio, the surfaces area ratio, Sdr, expresses the increment of an interfacial surface area relative to the area of the projected (i.e. flat) x, y plane:

$$S_{dr} = \frac{\left(\sum_{k=0}^{M-2}\sum_{l=0}^{N-2} A_{kl}\right) - (M-1)(N-1)\delta x \delta y}{(M-1)(N-1)\delta x \delta y} 100\%$$

where Akl is defined as:

$$A_{kl} = \frac{1}{4}\left(\begin{array}{l}\sqrt{\delta y^2 + (z(x_k, y_l) - z(x_k, y_{l+1}))^2} + \\ \sqrt{\delta y^2 + (z(x_{k+1}, y_l) - z(x_{k+1}, y_{l+1}))^2}\end{array}\right).$$

$$\left(\begin{array}{l}\sqrt{\delta x^2 + (z(x_k, y_l) - z(x_{k+1}, y_l))^2} + \\ \sqrt{\delta x^2 + (z(x_k, y_{l+1}) - z(x_{k+1}, y_{l+1}))^2}\end{array}\right)$$

For a totally flat surface, the surface area and the area of the xy plane are the same and Sdr=0%.

The projected area expresses the area of the flat x, y plane as given in the denominator of the first formula.

The surface area expresses the area of the surface area taking the z height into account as given in the numerator of the first formula.

Connection area between chip carrier and encapsulant as a consequence of roughening, the adhesion between the material of the chip carrier and the material of the encapsulant may be improved. It is believed that as a consequence of such a surface roughening, the connection surface is increased and an interlocking of microscopic structures between the roughened surface of the encapsulation section and an inverse profile of the encapsulant increases the adhesion.

In another embodiment, the encapsulation section has a roughness Rz of more than 1 μm, in particular of more than 2 μm. It has turned out that roughening the surface of the encapsulation section to the mentioned degree has a positive impact on the adhesion between the surface of the encapsulation section and the encapsulant material, in particular mold compound.

In an embodiment, the chip carrier comprises an electrically conductive structure (such as a copper film) constituting the encapsulation section and being partially covered by a sintering agent constituting the mounting section. By selecting different materials for the encapsulation section on the one hand and for the mounting section on the other hand, the particularities of their respective functions can be ideally adjusted with these materials. For instance, the electrically conductive structure constituting the encapsulation section may be copper or aluminum, whereas the electrically conductive material constituting the mounting section may be silver or other sinterable material.

In an embodiment, the chip carrier comprises an electrically insulating structure, in particular an electrically insulating and thermally conductive structure, on which the electrically conductive structure is formed. Thus, the core of the chip carrier may be a thermally conductive dielectric sheet, which may for instance be made of a ceramic (such as aluminum oxide or silicon nitride). Such a material may ensure electric decoupling between its opposing main surfaces. At the same time, it may significantly contribute to the heat dissipation during operation of the package, which may for instance be a power package. In particular, the material of the thermally conductive and electrically insulating material may have a thermal conductivity of at least 10 W/mK, more particularly of at least 50 W/mK, even more particularly of at least 100 W/mK.

In an embodiment, the chip carrier comprises another electrically conductive structure, wherein opposing main surfaces of the electrically insulating structure are covered by the electrically conductive structure and the other electrically conductive structure. Therefore, both opposing main surfaces of the thermally conductive and electrically insulating structure may be covered by a respective electrically conductive structure, for instance a continuous or a patterned metal foil such as a copper foil. When implementing such a chip carrier in the package, one of the electrically conductive structures may be encapsulated within an interior of the package, whereas the other electrically conductive structure may form part of an exterior surface of the package. This ensures a good heat dissipation.

In an embodiment, the chip carrier is configured as at least one of the group consisting of a ceramic substrate (for instance comprising aluminum nitride, silicon nitride, or aluminum oxide), a Direct Copper Bonding substrate, a Direct Aluminum Bonding substrate, a leadframe, and a printed circuit board. However, other configurations of the chip carrier are possible as well.

In an embodiment, the mounting section comprises or consists of a sintering agent by which the electronic chip is sintered on the chip carrier. The sintering agent may comprise a sinterable material such as silver.

In an embodiment, an undercut is formed as a lateral recess at the mounting section vertically between the chip carrier and the electronic chip (see FIG. 2). An undercut may mechanically suppress undesired migration paths of sinterable material (for instance silver) of the mounting section to an upper surface of the chip or to electrically conductive connection structures of the package. Such an undercut may be defined by overhanging material above and below the mounting section. It is believed to be highly advantageous for a proper adhesion of the encapsulant that the sintering material is exposed to the encapsulation compound, for instance a mold compound, only to a minimal extent. This can be achieved by rendering the mounting section smaller than the electronic chip attached thereto, so that the undercut or recess is formed. When the undercut is filled with the encapsulant material during encapsulation, the contact area between encapsulant material and material of the mounting section is very small. At the same time, an additional interlocking between the encapsulant material and other material delimiting the tiny recess may further improve overall adhesion within the package.

In an embodiment, an exposed surface of the mounting section being not covered by the electronic chip is covered by a protection structure, in particular at least one of an adhesion promoting structure and a migration inhibiting structure. The protection structure may hence encapsulate exposed surface portions of the mounting section, in particular of sinterable material thereof. This is a measure which can be taken additionally or alternatively to the previously mentioned formation of an undercut. The coverage of any exposed surface of the mounting section with the protection structure advantageously fully decouples the mounting section from the encapsulant.

In an embodiment, the encapsulant is a mold compound. For the encapsulating, a plastic material or a ceramic material may be used. The encapsulant may comprise an epoxy material. Filler particles (e.g. $SiO_2$, $Al_2O_3$, $Si_3N_4$, BN, AlN, diamond, etc.), for instance for improving thermal conductivity may be embedded in an epoxy-based matrix of the encapsulant. However, alternatively, the encapsulant may be a laminate, glass, and/or a silicone encapsulation.

In an embodiment, the package comprises a further chip carrier, in particular having the above mentioned features, connected to a main surface of the electronic chip opposing another main surface of the electronic chip to which the chip carrier is connected, so that the chip carrier and the further chip carrier provide for a double-sided cooling of the electronic chip. By removing heat generated by the one or more electronic chips of the package during operation from two opposing main surfaces thereof, a particularly efficient cooling may be accomplished which keeps thermal load small. Therefore, reliability of the package can be further improved by double-sided cooling. In particular, this may be accomplished highly preferably by two DCB-type substrates.

In an embodiment, the encapsulation section is roughened by at least one of chemically roughening and mechanically roughening. Chemically roughening may involve an etching procedure which transfers only a part of a metal surface (in particular copper surface) into copper oxide, so that subsequent removal of at least part of the copper oxide results in a roughened structure. Mechanically roughening may be performed by subjecting the surface to be roughened to a corresponding mechanical impact.

In an embodiment, the mounting section is formed by at least one of chemical plating and physical plating. However, other deposition procedures may be implemented as well for forming the mounting section.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
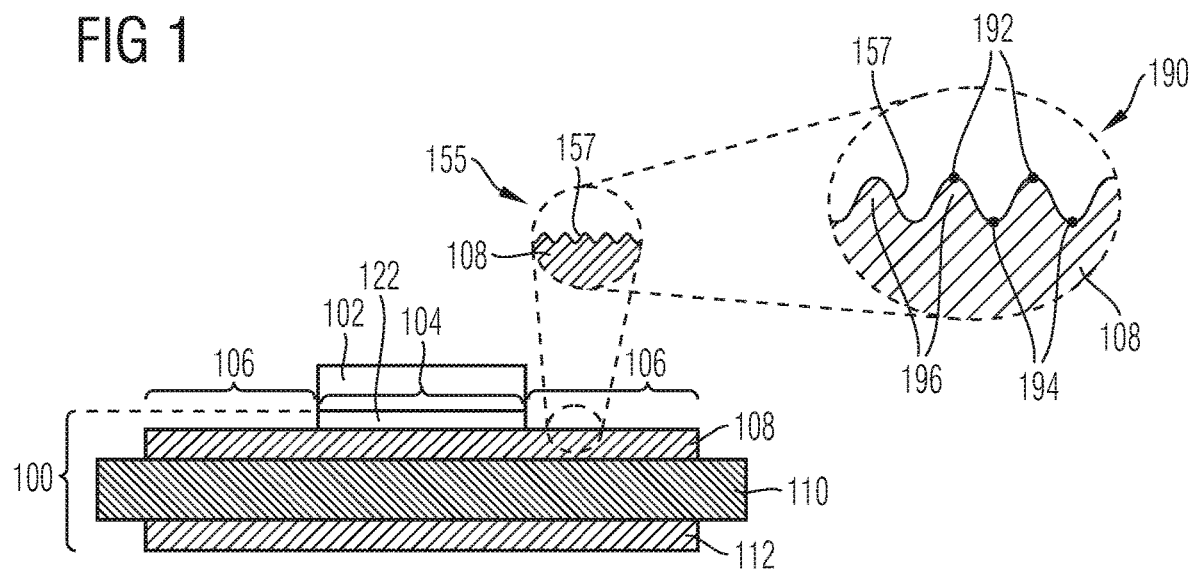
FIG. 1 shows a cross-sectional view of a chip carrier according to an exemplary embodiment.

The illustration in the drawing is schematically.

Before describing further exemplary embodiments in further detail, some basic considerations of the present inventors will be summarized based on which exemplary embodiments have been developed which provide for an efficient manufacture of a reliable package.

Power modules may incorporate one or more ceramic substrates or other chips carriers, which serve as insulator, thermal conductor or mechanical platform for the module. Such chip carriers are ceramic substrates like DCB (Direct Copper Bonding) substrates, AMB (Active Metal Brazing) substrates, etc. Another type of chip carriers are leadframe chip carriers. Yet another type of chip carriers are PCBs (printed circuit boards).

However, there is a need for a package which allows to combine the requirement to utilize sintered die attach and molded encapsulation. These attachments or connections require different surface and physical preconditions. Exemplary embodiments of the invention provide a packaging architecture solving this challenge.

According to an exemplary embodiment of the invention, a die carrier or chip carrier (such as a ceramic substrate, leadframe or otherwise) is provided which has at least two separate functional surface areas:

At least one zone may be configured specifically for sintering (more specifically for silver sintering). It is specifically preferred to configure such at least one zone as a noble metal finish (for instance made of silver, gold, platinum or palladium) or a metal of the same or a similar composition as a sintering agent (for example silver sintering on silver plating, or more generally metal sintering on plating on the basis of the same metal). Additionally or alternatively, this at least one zone may be rendered specifically appropriate for sintering by ensuring that the at least one zone is free of contaminants that may accelerate electrochemical migration. Specifically, but not exclusively, such contaminants are sulfur, halogenides (bromine, chlorine, etc.), preferably with less than 100 ppm.

In addition to this, an exemplary embodiment of the invention provides at least one further zone of the chip carrier being specifically configured for overmolding. For instance, such at least one further zone may have a roughened or rough surface, for example having a surface roughness Rz of at least 2 µm. From another viewpoint in terms of roughening, microstructures in a range from 0.25 µm to 20 µm may be formed (see FIG. 1).)

Hence, exemplary embodiments of the invention provide an appropriately configured surface for molded packages with sintered attachments.

According to an exemplary embodiment of the invention, measures may be taken that a transition between the different functional areas or zones is compatible with the manufacture of a highly reliable package. In this context, it has turned out to be advantageous for the adhesion of the mold compound on the chip carrier that the sintering zone is not (or only to a very limited extent) exposed to the encapsulating compound. In one embodiment of the invention, this can be realized by making the sintering surface smaller than the surface of the attached die or chip, so that the sinter (in particular silver) surface remaining exposed after chip mounting is kept very small (thereby also keeping the available active surface for migration very small). Additionally or alternatively it is possible to encapsulate the exposed sinter (in particular silver) surface by using a protection structure (such as an adhesion promoter or a separation structure or layer). In still another exemplary embodiment, it is also possible to combine the latter mentioned two measures, i.e. to provide an undercut and an additional protection structure.

Advantageously, a (for instance copper) roughening process for configuring the above-mentioned at least one further zone with proper adhesion concerning encapsulation material can be performed for example by chemical roughening (in particular etching of grain structure). Additionally or alternatively, it is also possible to establish a mechanical roughening procedure (for example grinding, lapping, etc.).

Such a roughening procedure may be performed prior to (in particular silver) plating for providing a sinterable surface. This prevents the later applied sinterable material from making an undesired chemical interaction with one or more chemical agents which may be used for the roughening procedure. When implementing one or more electronic chips being compatible with a roughening procedure, even roughening after having sintered such one or more electronic chips on the sinterable surface may be advantageous, since a roughened surface of the at least one electronic chip may further improve adhesion between the at least one electronic chip and the encapsulation material. Furthermore, the already mounted at least one electronic chip may decouple the sinterable surface with regard to one or more chemical agents used for the roughening procedure to thereby prevent or at least reduce the above-mentioned undesired interaction.

In an embodiment of the invention, the functional plating of the sintering, i.e. formation of the mounting surface, can be performed by partial chemical plating (for instance with partial plating through photoresist or otherwise). Additionally or alternatively, partial physical plating (such as sputtering, physical vapor deposition (PVD), chemical vapor deposition (CVD), etc.) may be implemented.

FIG. 1 shows a cross-sectional view of a chip carrier 100 according to an exemplary embodiment.

The illustrated chip carrier 100 is configured for carrying an electronic chip 102 on amounting section 104 of the chip carrier 100. In fact, FIG. 1 shows a scenario in which the electronic chip 102 is already mounted on the chip carrier 100. In order to accomplish this mounting task, the mounting section 104 is configured for mounting the electronic chip 102 by sintering, i.e. comprises a sintering agent 122 as sinterable material. In addition to this, another surface of the chip carrier 100 is configured as an encapsulation section 106 roughened for being encapsulated by a mold-type encapsulant 138 with high mutual adhesion (compare FIG. 4). The topography of roughened surface 157 can be taken from a detail 155 in FIG. 1 showing such a roughened surface 157.

As can be taken from detail 155, a part of a copper surface of a first electrically conductive structure 108 of the chip carrier 100 being in direct contact with encapsulant 138 after encapsulation (compare FIG. 4) is roughened by micropatterning, see microstructures 196. Preferably, the roughened copper surface has microstructures 196 with dimensions in a range between 1 µm and 4 µm, for instance with dimensions of about 2 µm. Referring to a further detail 190 of FIG. 1 this means that a height difference between top positions 192 and bottom positions 194 of the microstructures 196 may be in a range between 1 µm and 4 µm. Contrary to this, a smooth copper surface may for instance have a corresponding roughness of 0.1 µm.

The mounting section 104 is configured for mounting the electronic chip 102 by silver sintering. The mounting section 104 is defined by an area on the electrically conductive structure 108 which is provided with sintering agent 122 by which the electronic chip 102 is mounted on the mounting section 104 by sintering. For example, the mounting section 104 may be formed by chemically plating or physically plating a corresponding surface of the underlying electrically conductive structure 108. For this purpose, the mounting section 104 comprises a noble metal finish, in particular comprising silver. In order to further promote a strong and reliable sintering connection, care is taken and a corresponding conditioning procedure may be carried out ensuring that the mounting section 104 is substantially free of contaminants (in particular free of sulphur and halogenides) that may otherwise accelerate undesired electrochemical migration. By strongly suppressing electrochemical migration, a highly reliable electric and mechanical bonding of the electronic chip 102 on the mounting section 104 can be ensured. It has turned out that a highly reliable connection may be obtained when a concentration of the above mentioned contaminants in the mounting section 104 is preferably not more than 100 ppm. Moreover, care should be taken that the mounting section 104 is substantially free of surface oxide. Noble metals such as silver do not have a strong tendency of forming surface oxide and are therefore a preferred material for the mounting section 104. In the presence of a surface oxide (in particular a metal oxide on an exterior surface of the mounting section 104 exposed to an environmental air atmosphere), the surface oxide may be removed prior to sintering, for instance by a chemical treatment and/or a mechanical treatment. To obtain a planar mounting section 104 being therefore highly appropriate for mounting the electronic chip 102 by sintering with high positional accuracy, it is preferred that the exterior surface of the mounting section 104 is relatively smooth, in particular smoother than an adjacent surface of encapsulation section 106.

In order to promote adhesion between encapsulant 138 and chip carrier 100, a specific roughening procedure may be carried out for selectively increasing a connection surface of the encapsulation section 106 to be covered with material of the encapsulant 138 after encapsulation. In particular, the encapsulation section 106 may be roughened by chemically roughening. In the shown embodiment, the electrically conductive structure 108, which is here embodied as a copper foil, constitutes the encapsulation section 106. A portion of the electrically conductive structure 108 is covered by a further electrically conductive structure, in the shown embodiment made of silver, constituting the mounting section 104.

As can furthermore be taken from FIG. 1, the chip carrier 100 additionally comprises an electrically insulating and thermally conductive structure 110, on which the electrically conductive structure 108 is formed. The electrically insulating and thermally conductive structure 110 may be made of a ceramic such as aluminum oxide, aluminum nitride or silicon nitride. Such materials have a high thermal conductivity (preferably at least 10 W/mK) and therefore significantly contribute to the removal of heat from the electronic chip 102 in a readily encapsulated package 120 during operation. Moreover, the chip carrier 100 comprises another electrically conductive structure 112, which is here also embodied as a copper layer. Both opposing main surfaces of the electrically insulating structure 110 are hence covered by the electrically conductive structure 108 and the other electrically conductive structure 112. Thus, reference numerals 108, 110, 112 of the chip carrier 100 constitute a Direct Copper Bonding (DCB) substrate with different specifically configured surface portions.

As can be taken from FIG. 1 as well, the material of the mounting section 104, in particular sinterable silver, does not extend laterally beyond the side walls of the electronic chip 102. More specifically, the side walls of the mounting section 104 and the side walls of the electronic chip 102 are in flush. Therefore, excessive undesired interaction between material of the encapsulant 138 and material of the mounting section 104 can be prevented, since the mutual contact surface is very small.

In view of this, the chip carrier 100 shown in FIG. 1 is particularly advantageously compatible both with a chip sinter connection procedure and a mold-type encapsulation procedure.

Figure 2:
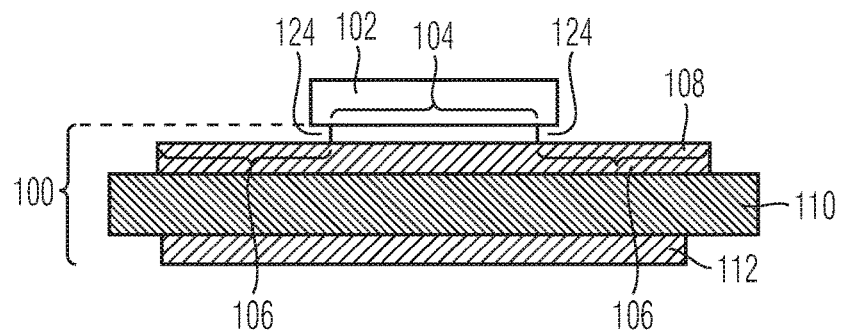
FIG. 2 shows a cross-sectional view of a chip carrier according to another exemplary embodiment.

FIG. 2 shows a cross-sectional view of a chip carrier 100 according to another exemplary embodiment.

According to FIG. 2, an undercut 124 is formed as a lateral recess vertically between the electrically conductive structure 108 and the electronic chip 102. Thus, a horizontal surface area of the sinterable material of the mounting section 104 is smaller than a main surface area of the electronic chip 102.

With the undercut 124 according to FIG. 2, the interaction between material of the encapsulant 138 and material of the mounting section 104 can be further suppressed. This has a positive impact on reliability and delamination-free interconnection within a package 120 formed on the basis of the chip carrier 100 of FIG. 2.

Figure 3:
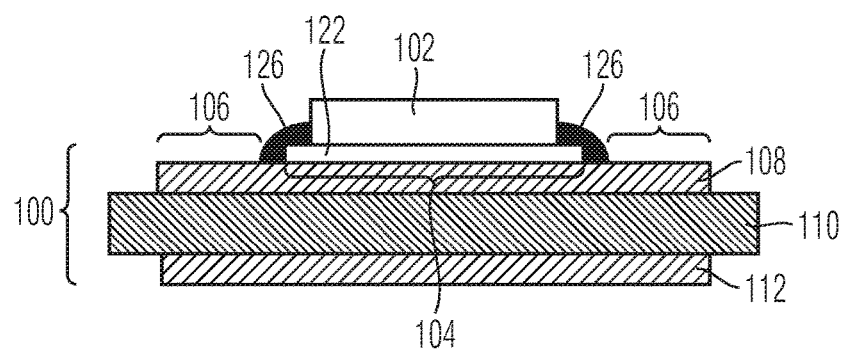
FIG. 3 shows a cross-sectional view of a chip carrier according to still another exemplary embodiment.

FIG. 3 shows a cross-sectional view of a chip carrier 100 according to still another exemplary embodiment.

In the embodiment of FIG. 3, an exposed lateral surface of the mounting section 104 being not covered by the electronic chip 102 is covered by a protection structure 126.

By providing the protection structure 126, for instance made of an adhesion promoter such as polyimide or silane, the interaction between the materials of the mounting section 104 and of the encapsulant 136 can be further suppressed. This further strengthens mechanical integrity of a correspondingly manufactured package 120. Moreover, the protection structure 126 additionally promotes adhesion with the connected materials.

Although not shown in FIG. 2 and FIG. 3, the measures taken there for improving adhesion by suppressing a strong interaction between the sinterable material of the mounting section 104 on the one hand and the material of the encapsulant 138 (see FIG. 4) on the other hand may even be combined. Hence, it is possible that the provision of an undercut 124 may be combined with the provision of a protection structure 126 which thereby fills also the undercut 124. Such an embodiment provides a package 120 with a particularly high reliability.

Figure 4:
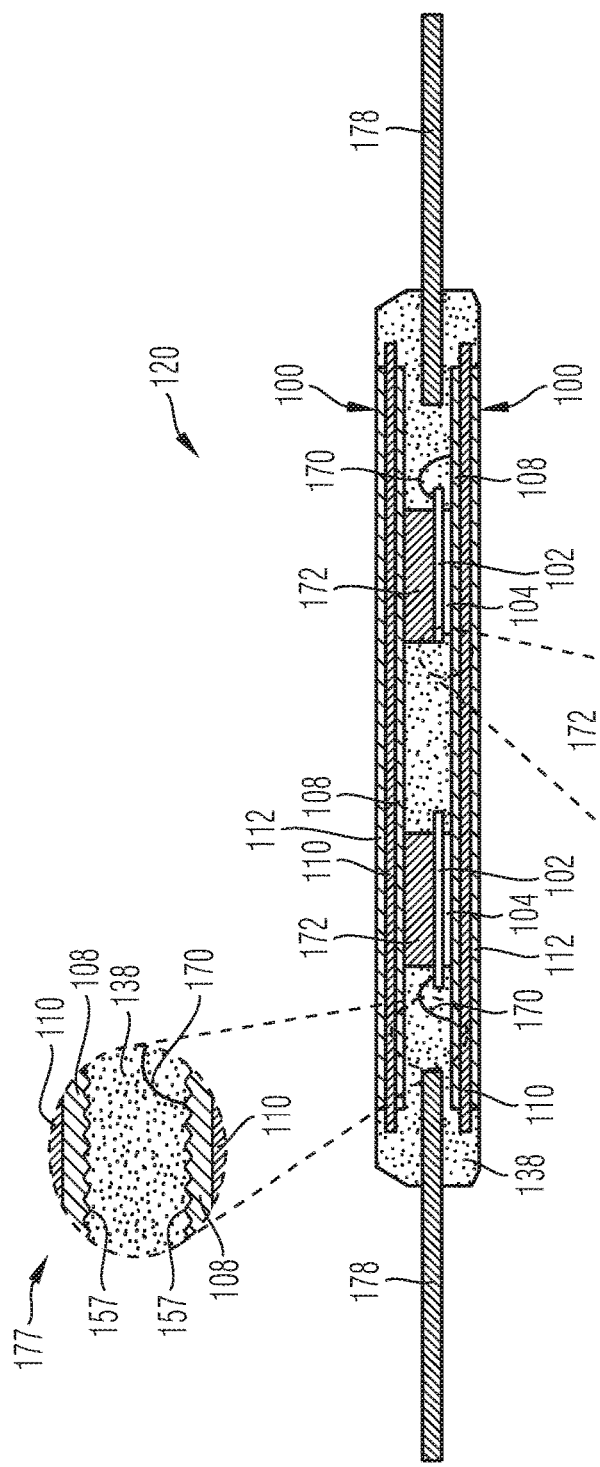
FIG. 4 shows a cross-sectional view of a double-sided cooling package according to another exemplary embodiment.

FIG. 4 shows a cross-sectional view of a double-sided cooling package 120 according to another exemplary embodiment.

The package 120 according to FIG. 4 comprises two (any other number is possible) electronic chips 102 which are here embodied as power semiconductor chips. The electronic chip 102 shown on the left hand side of FIG. 4 may be a diode chip, whereas the electronic chip 102 shown on the right-hand side of FIG. 4 may be an IGBT (Insulated Gate Bipolar Transistor) chip.

A first chip carrier 100, which is here embodied as Direct Copper Bonding (DCB) type substrate configured in a similar manner as shown in FIG. 2 (or FIG. 1 or FIG. 3), is thermally and mechanically coupled to a first main surface of the electronic chips 102 by sintering and forms part of an exterior surface of the package 120. The first chip carrier 100 is configured for removing thermal energy from the electronic chips 102 during operation of the package 120 to a package external cooling body and/or cooling fluid (not shown). The first chip carrier 100 comprises central electrically insulating and thermally conductive layer 110, here made of ceramic material, having a first main surface covered by first electrically conductive layer 108, which is here embodied as a copper layer, and having an opposing second main surface covered by second electrically conductive layer 112, which is here embodied as a further copper layer. The electronic chips 102 are mounted and sintered on respective mounting sections 104 (for a detailed description, compare FIG. 1 to FIG. 3) of the first chip carrier 100 and are electrically connected with the first electrically conductive layer 108 by bond wires 170. The first chip carrier 100 also functions as a heat sink. The second electrically conductive layer 112 of the first chip carrier 100 forms part of an exterior surface of the package 120 and thereby significantly contributes to the heat removal from the electronic chips 102 during operation of the package 120.

Optional spacer bodies 172, which may be embodied as copper blocks, are soldered or sintered onto upper main surfaces of the electronic chips 102.

Moreover, a second chip carrier 100 is thermally coupled to a second main surface of the electronic chips 102 via the spacer bodies 172. The second chip carrier 100 may or may not be configured as the first chip carrier 100, but may also be a normal DCB substrate. Also the second chip carrier 100 comprises a central electrically insulating and thermally conductive layer 110, which may be made of ceramic, having a first main surface covered by a first electrically conductive layer 108, which is here embodied as a copper layer, and having an opposing second main surface covered by a second electrically conductive layer 112, which is here embodied as a further copper layer. The first electrically conductive layer 108 of the second chip carrier 100 may be soldered onto the spacer bodies 172. The second electrically conductive layer 112 of the second chip carrier 100 forms part of an exterior surface of the package 120 and thereby significantly contributes to the heat removal from the electronic chips 102 during operation of the package 120. As a whole, the second chip carrier 100 is configured as a heat sink for removing thermal energy from the electronic chips 102.

An electrically conductive contact structure 178, here embodied as a leadframe, extends partially within and partially outside of an encapsulant 138 and is electrically coupled with the electronic chips 102 via a solder connection with the patterned first electrically conductive layer 108 of the first chip carrier 100 and via the bond wires 170.

Furthermore, the package 120 comprises the mold-type encapsulant 138 encapsulating the electronic chips 102, the spacer bodies 172, only part of the electrically conductive contact structure 178, only part of the first chip carrier 100 and only part of the second chip carrier 100. The part of the electrically conductive contact structure 178 encapsulated by the encapsulant 108 serves for electrically contacting the electronic chips 102, whereas another part of the electrically conductive contact structure 178 exposed from the encapsulant 138 provides one or more leads for connection with an electronic periphery device (not shown). Since the electrically conductive contact structure 178 extends partially within and partially outside of the encapsulant 138 and is electrically coupled with the electronic chips 102, it is capable of providing an electric coupling between an exterior and an interior of the package 120.

A detail 179 shows that material of the encapsulant 138 also extends into and fills the undercut 124 between the roughened first electrically conductive structure 108 and the respective electronic chip 102.

As can be taken from a detail 177, the part of the copper surface of the first chip carrier 100 being in direct contact with the encapsulant 138 is roughened by micropatterning, see reference numeral 157. As can be taken from detail 177 as well, the part of the copper surface of the second chip carrier 100 being in direct contact with the encapsulant 138 is roughened by micropatterning as well.

Preferably, the roughened copper surfaces have microstructures with dimensions in a range between 1 μm and 4 μm, for instance with dimensions of about 2 μm. This means that a height difference between top positions and bottom positions of the microstructures may be in a range between 1 μm and 4 μm. Contrary to this, a smooth copper surface may for instance have a corresponding roughness of 0.1 μm.

Due to the provision of the first chip carrier 100 and the second chip carrier 100, the package 120 is configured for double-sided cooling. In other words, the two electronic chips 102 are connected to the two heat removal bodies or chip carriers 100 so that thermal energy is removable from two opposing main surfaces of the package 120. Thus, the cooling efficiency of the package 120 is very high. However, the enormous amount of heat generated by the package 120 during operation of the package 120 and the removal of such a large amount of heat also generates high thermal load within the package 120. This conventionally results in the danger of delamination within the package 120. However, due to the roughening of the various copper surfaces, as described above, the adhesion between the encapsulant 138 and the adjacent copper structures can be significantly increased.

Highly advantageously, the procedure of micropatterning the mentioned copper surfaces may be carried out—during the manufacture of the package 120—before mounting, sintering and wire bonding the electronic chips 102 on the first chip carrier 100. Thus, it can be ensured that the sensitive electronic chips 102 are not negatively influenced by the roughening procedure. The roughening may be carried out by oxidizing part of a respective copper surface by a first etching procedure, and by subsequently removing copper oxide by a second etching procedure. The reproducibility and quality of the micropatterning can be further improved by cleaning the surface to be roughened prior to the micropatterning. To further improve adhesion, it is possible to remove particles from the micropatterned surface after the micropatterning, in particular by deoxidizing. For instance, copper oxide or another oxide may be removed by such a procedure.

The package 120 may be manufactured as follows: The first chip carrier 100 may be provided as described referring to FIG. 1 to FIG. 3. The second chip carrier 100 may be provided as DCB substrate, and may be roughened. Thereafter, the electronic chips 102 may be sintered onto the first chip carrier 100. After that, connection of the electrically conductive contact structure 178 with the first chip carrier 100 may be accomplished by soldering, wire bonding, etc. Then, the optional spacer bodies 172 may be soldered on top of the electronic chips 102. This can be followed by a solder connection of the second chip carrier 100 on the spacer bodies 172. After that, encapsulation by molding may be carried out so that the encapsulant 138 fills the gaps between the mentioned constituents and keeps external surfaces of the chip carriers 100 uncovered.

For the package 120 of FIG. 4, any of the chip carriers 100 may be embodied as shown in FIG. 1 to FIG. 3.

Figure 5:
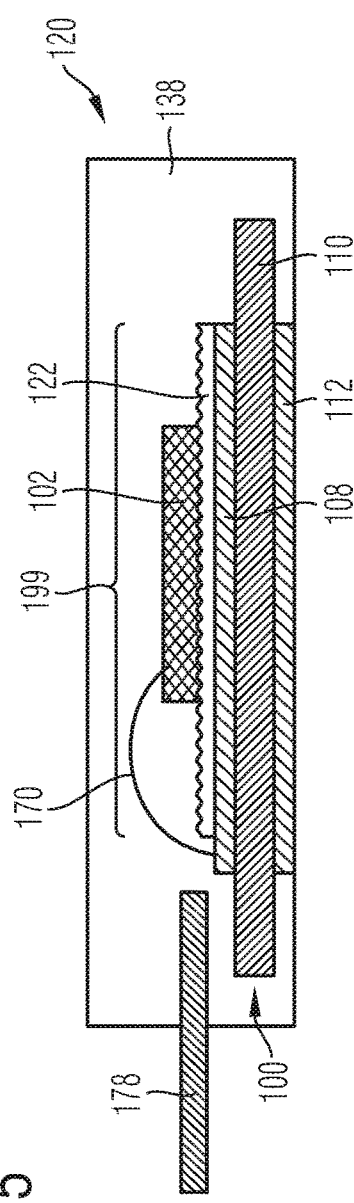
FIG. 5 shows a cross-sectional view of a package with a chip carrier according to yet another exemplary embodiment.

FIG. 5 shows a cross-sectional view of a package 120 with a chip carrier 100 according to another exemplary embodiment.

The chip carrier 100 according to FIG. 5 is also configured for carrying an electronic chip 102. Correspondingly, such an electronic chip 102 is mounted on the chip carrier 100 of the package 120. In contrast to the embodiments described referring to FIG. 1 to FIG. 4, the chip carrier 100 according to FIG. 5 comprises a single combined mounting and encapsulation section 199 made of a homogeneous material. The mounting and encapsulation section 199 provides a common surface configured for mounting the electronic chip 102 and being roughened for being encapsulated by encapsulant 138. The mounting and encapsulation section 199 is here configured as a rough surface noble metal finish, for instance a sinterable silver layer with an exposed surface with microprotrusions 196 of a height in a range between 1 μm and 4 μm. Thus, the above described surface requirements in terms of sintering and soldering are fused in one functional surface (i.e. the mounting and encapsulation section 199) in FIG. 5, which fulfils at least one of each of the above described category requirements.

Hence, the above described separately fulfilled surface requirements in terms of sintering and encapsulation may be fused in one functional surface, which for example may be a rough surface noble metal finish.

With regard to the other reference numerals in FIG. 5, reference is made to the above description of FIG. 1 to FIG. 4. All the measures disclosed there can be implemented correspondingly in the embodiment of FIG. 5.

Figure 6:
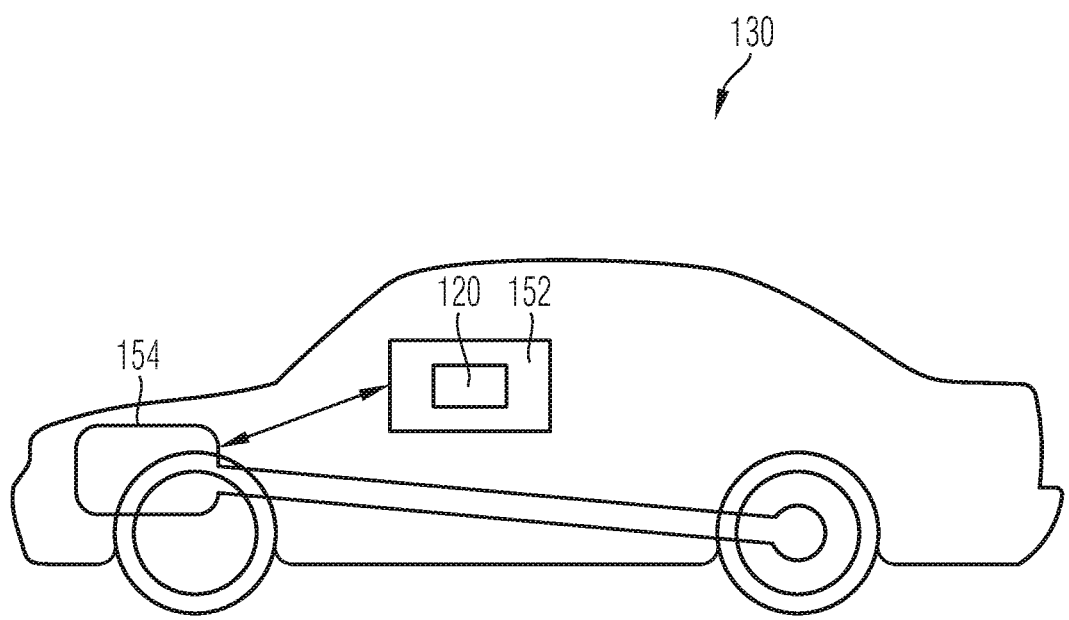
FIG. 6 shows a schematic view of a vehicle with a package according to an exemplary embodiment.

FIG. 6 shows a schematic view of a vehicle 130 with a package 120 according to an exemplary embodiment.

More specifically, the power package 120 may form part of a control block 152 controlling operation of engine/battery block 154. Hence, a package or power module 120 according to an exemplary embodiment of the invention may be used for an automotive application. A preferred application of such a power package 120 is an implementation as an inverter circuit or inverted rectifier for vehicle 130 which may be an electrically driven vehicle or which may be a hybrid vehicle. Such an inverter may transfer a direct current (DC) of the battery into an alternating current (AC) for driving the electric engine of vehicle 130. In a hybrid vehicle, it is also possible to at least partially recover mechanical energy and to transfer it, by the inverter, back into electric energy to recharge the battery. In such an automotive inverter application, extreme amounts of heat are generated during operation of the power module 120. This heat can be efficiently removed by the double-sided cooling concept according to FIG. 4. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A chip carrier for carrying an electronic chip, wherein the chip carrier comprises:
   a mounting section configured for mounting an electronic chip by sintering;
   an encapsulation section configured for being encapsulated by an encapsulant,
   wherein an exposed surface of the encapsulation section has a higher roughness than an exposed surface of the mounting section,
   wherein the exposed surface of the encapsulation section and the exposed surface of the mounting section facing in the same direction and are formed along a common planar surface of the chip carrier.

2. The chip carrier according to claim 1, wherein the encapsulation section is roughened.

3. The chip carrier according to claim 1, wherein the mounting section comprises a metal finish, in particular a noble metal finish, more particularly one of the group consisting of gold, silver, platinum, and palladium.

4. The chip carrier according to claim 1, wherein the mounting section is substantially free of contaminants that promote electrochemical migration, in particular is substantially free of at least one contaminant of the group consisting of sulphur and halogenides.

5. The chip carrier according to claim 1, wherein the mounting section is substantially free of surface oxide, in particular metal oxide.

6. The chip carrier according to claim 1, wherein the encapsulation section has microstructures where a relation between a projected surface area and a flattened surface area is larger than 1.1, in particular is larger than 1.5.

7. The chip carrier according to claim 1, comprising an electrically conductive structure forming at least part of the encapsulation section and being partially covered by a sintering agent constituting the mounting section.

8. The chip carrier according to claim 7, comprising an electrically insulating structure, in particular an electrically insulating and thermally conductive structure, on which the electrically conductive structure is formed.

9. The chip carrier according to claim 8, comprising another electrically conductive structure, wherein opposing main surfaces of the electrically insulating structure are covered by the electrically conductive structure and the other electrically conductive structure.

10. The chip carrier according to claim 1, configured as at least one of the group consisting of a ceramic substrate, a Direct Copper Bonding substrate, a Direct Aluminum Bonding substrate, a leadframe, and a printed circuit board.

11. The chip carrier according to claim 1, comprising at least one of the following features:
    a surface of the encapsulation section is hydrophilic;
    a surface of the mounting section is hydrophobic;
    the surface of the encapsulation section is more hydrophilic than the surface of the mounting section.

12. A chip carrier for carrying an electronic chip, wherein the chip carrier comprises
    a mounting and encapsulation section having a common homogeneous surface configured for mounting an electronic chip by sintering and being roughened for being encapsulated by a mold-type encapsulant, and
    an electrically conductive layer onto which the mounting and encapsulation sections are formed,
    wherein the electrically conductive layer having a bonding section to which a wire is bondable,
    wherein the bonding section has an exposed surface extending laterally from the mounting and encapsulation section,
    wherein the common homogeneous surface of the exposed surface of the mounting section has a higher roughness than the exposed surface of the bonding section.

13. The chip carrier according to claim 12, wherein the mounting and encapsulation section is configured as a sinter metal structure with roughened surface.

14. A package, comprising:
    a chip carrier according to claim 1;
    at least one electronic chip mounted on the mounting section of the chip carrier;
    an encapsulant encapsulating at least part of the at least one electronic chip and at least part of the encapsulation section.

15. The package according to claim 14, wherein the mounting section comprises a sintering agent by which the electronic chip is sintered on the chip carrier.

16. The package according to claim 14, wherein an undercut is formed at the mounting section between the chip carrier and the electronic chip.

17. The package according to claim 14, wherein an exposed surface of the mounting section being not covered by the electronic chip is covered by a protection structure.

18. The package according to claim 14, wherein the encapsulant comprises at least one of the group consisting of a mold compound, a laminate, glass, and a silicone casting.

19. The package according to claim 14, comprising a further chip carrier, in particular according to claim 1, connected to a main surface of the electronic chip opposing another main surface of the electronic chip to which the chip carrier is connected, so that the chip carrier and the further chip carrier provide for a double-sided cooling of the electronic chip.

20. A method of using a package according to claim 14 for an automotive application.

21. A method of manufacturing a package, wherein the method comprises:
   providing a chip carrier according to claim 1;
   sintering at least one electronic chip on the mounting section of the chip carrier;
   encapsulating at least part of the at least one electronic chip and at least part of the encapsulation section by an encapsulant.

22. A vehicle, comprising a chip carrier according to claim 1.

* * * * *